United States Patent
Ye et al.

(10) Patent No.: US 8,772,805 B2
(45) Date of Patent: Jul. 8, 2014

(54) HIGH EFFICIENCY LIGHT EMITTING DIODE AND METHOD FOR FABRICATING THE SAME

(75) Inventors: Kyung Hee Ye, Ansan-si (KR); Chang Youn Kim, Ansan-si (KR); Jin Cheol Shin, Ansan-si (KR); Joon Hee Lee, Ansan-si (KR); Jong Kyun You, Ansan-si (KR); Hong Chol Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 125 days.

(21) Appl. No.: 13/018,557

(22) Filed: Feb. 1, 2011

(65) Prior Publication Data

US 2011/0241045 A1     Oct. 6, 2011

(30) Foreign Application Priority Data

Mar. 31, 2010 (KR) .................. 10-2010-0029264
Jun. 25, 2010 (KR) .................. 10-2010-0060290

(51) Int. Cl.
*H01L 33/00* (2010.01)

(52) U.S. Cl.
USPC .................. 257/98; 257/79; 257/81; 257/94; 257/100; 257/E33.005; 257/E33.067; 257/E33.062; 257/E21.211; 438/22; 438/25; 438/26; 438/29

(58) Field of Classification Search
USPC .......... 257/79, 81, 94, 98–100, 103, E33.005, 257/E33.067, E33.001, E33.062, E21.211; 438/22, 25, 26, 29
See application file for complete search history.

(56) References Cited

U.S. PATENT DOCUMENTS

| | | | |
|---|---|---|---|
| 6,744,071 B2 | 6/2004 | Sano et al. | |
| 7,704,763 B2 | 4/2010 | Fujii et al. | |
| 2005/0277218 A1* | 12/2005 | Nakajo et al. | 438/46 |
| 2007/0065960 A1* | 3/2007 | Fukshima et al. | 438/42 |
| 2010/0078659 A1* | 4/2010 | Iizuka et al. | 257/94 |
| 2010/0230705 A1 | 9/2010 | Jeong | |
| 2011/0024781 A1 | 2/2011 | Fujimoto et al. | |

FOREIGN PATENT DOCUMENTS

WO   WO 2009010762 A1 *  1/2009

OTHER PUBLICATIONS

Non-Final Office Action issued on Apr. 4, 2013 in U.S. Appl. No. 13/077,254.
Notice of Allowance issued on Mar. 6, 2014 in U.S. Appl. No. 13/077,254.
Final Office Action issued on Dec. 19, 2013 in U.S. Appl. No. 13/077,254.

* cited by examiner

*Primary Examiner* — Meiya Li
(74) *Attorney, Agent, or Firm* — H.C. Park & Associates, PLC

(57) ABSTRACT

A high-efficiency light emitting diode including: a semiconductor stack positioned on a support substrate, including a p-type compound semiconductor layer, an active layer, and an n-type compound semiconductor layer; an insulating layer disposed in an opening that divides the p-type compound semiconductor layer and active layer; a transparent electrode layer disposed on the insulating layer and the p-type compound semiconductor layer; a reflective insulating layer covering the transparent electrode layer, to reflect light from the active layer away from the support substrate; a p-electrode covering the reflective insulating layer; and an n-electrode is formed on top of the n-type compound semiconductor layer. The p-electrode is electrically connected to the transparent electrode layer through the insulating layer.

23 Claims, 12 Drawing Sheets

HIGH EFFICIENCY LIGHT EMITTING DIODE AND METHOD FOR FABRICATING THE SAME

CROSS-REFERENCE TO RELATED APPLICATIONS

This application claims priority from and the benefit of Korean Patent Application No. 10-2010-0029264, filed on Mar. 31, 2010, and Korean Patent Application No. 10-2010-0060290, filed on Jun. 25, 2010, which are both hereby incorporated by reference for all purposes as if fully set forth herein.

BACKGROUND

1. Field

The present disclosure relates to light emitting diodes (LEDs) and methods of fabricating the same.

2. Discussion of the Background

In general, Group-III-element nitrides, such as gallium nitride (GaN) and aluminum nitride (AlN), have excellent thermal stability and a direct-transition-type energy band structure. As such, Group-III-element nitrides have recently come into the spotlight as materials for light emitting devices that emit visible and ultraviolet wavelengths. Particularly, blue light emitting devices and green light emitting devices using indium gallium nitride (InGaN) are used in various applications, such as large-sized full-color flat panel displays, traffic lights, indoor illumination, high-density light sources, high-resolution output systems, and optical communications.

Since it is difficult to fabricate a homogeneous substrate for the growth of such Group-III-element nitride semiconductors, Group-III-element nitride semiconductor layers are generally grown on a heterogeneous substrate having a similar crystal structure to that of the semiconductor layer, through processes such as metal organic chemical vapor deposition (MOCVD) and molecular beam epitaxy (MBE). A sapphire substrate having a hexagonal system structure is frequently used as the heterogeneous substrate. However, since sapphire is an electrical insulator, it limits the structure of a light emitting diode (LED) grown thereon. Accordingly, a technique has recently been developed in which epitaxial layers, such as nitride semiconductor layers, are grown on a heterogeneous substrate such as sapphire. A support substrate is bonded to the epitaxial layers, and the heterogeneous substrate is then separated using a laser lift-off technique or the like, thereby fabricating a high-efficiency vertical-type LED (e.g., see U.S. Pat. Nos. 6,744,071 and 7,704,763).

Such a vertical-type LED is fabricated by sequentially forming an n-type GaN layer, an active layer, and a p-type GaN layer on a sapphire growth substrate, forming a p-electrode and a reflective metal layer on the p-type GaN layer, bonding a support substrate thereon, removing the sapphire substrate, and then forming an n-electrode or n-electrode pad on the exposed n-type semiconductor layer. A conductive substrate is generally used as the support substrate. Thus, the LED has a vertical structure, in which the n-electrode and the p-electrode are disposed opposite to each other.

However, Ag, which is frequently used as a reflection layer while being in ohmic-contact with the p-type GaN layer, may become aggregated during a heating process. Further, since current leakage may occur due to the migration of Ag atoms when the LED is driven, it is difficult to form a stable ohmic metal reflection layer. Furthermore, Ag also has reflectance limitations.

FIG. 1 is a sectional view illustrating a conventional vertical-type LED. Referring to FIG. 1, the conventional LED is fabricated by sequentially forming a GaN-based n-type layer 1, a GaN-based active layer 2, and a GaN-based p-type layer 3 on a growth substrate (not shown), to form a light emitting structure 4. Then, a p-type electrode 5 is formed on the p-type layer 3, the p-type electrode 5 is flip-bonded to a Si submount 7 through a bonding metal 6, the growth substrate is removed, and then an n-electrode 8 is formed on the exposed n-type layer 1. Meanwhile, an n-type electrode 9 is formed on the bottom surface of the Si submount 7. Furthermore, in U.S. Pat. No. 7,704,763, the surface of the exposed n-type layer 1 is roughened using a dry or photo-electro chemical (PEC) etching technique, thereby enhancing the light extraction efficiency thereof.

SUMMARY

Exemplary embodiments of the present invention provide a high-efficiency light emitting diode (LED) having a structure that enhances the extraction of light generated in an is active layer and a method for fabricating the same.

Exemplary embodiments of the present invention also provide a high-efficiency LED, in which the reflectance of light emitted toward a support substrate is improved and a method of fabricating the same.

Additional features of the invention will be set forth in the description which follows, and in part will be apparent from the description, or may be learned by practice of the invention.

An exemplary embodiment of the present invention discloses an LED comprising: a support substrate; a stacked semiconductor structure positioned on the support substrate, the semiconductor stack including a p-type compound semiconductor layer, an active layer, and an n-type compound semiconductor layer, the p-type compound semiconductor layer being positioned closer to the support substrate than the n-type compound semiconductor layer; an opening formed in the p-type compound semiconductor layer and active layer to divide the same into at least two regions, the opening exposing the n-type compound semiconductor layer there through; an insulating layer covering the exposed surface of the n-type compound semiconductor layer and sidewalls of the opening; a transparent electrode layer disposed in ohmic-contact with the p-type compound semiconductor layer, covering the insulating layer and the p-type compound semiconductor layer; a reflective insulating layer formed to cover the transparent electrode layer, the reflective insulating layer reflecting the light emitted toward the support substrate from the active layer; a p-electrode formed to cover the reflective insulating layer; and an n-electrode formed on top of the n-type compound semiconductor layer. A portion of the reflective insulating layer is removed to expose the transparent electrode layer, and the p-electrode is electrically connected to the exposed transparent electrode layer.

An exemplary embodiment of the present invention discloses a method for fabricating an LED, comprising: growing epitaxial layers including an n-type compound semiconductor layer, an active layer, and a p-type compound semiconductor layer on a growth substrate; etching the p-type compound semiconductor layer and the active layer, thereby forming an opening through which the n-type compound semiconductor layer is exposed; forming an insulating layer to cover the exposed surface of the n-type compound semiconductor layer and sidewalls of the opening; forming a transparent electrode layer to cover the insulating layer and the p-type compound semiconductor layer; forming a reflective insulating layer to cover the transparent electrode layer; removing a portion of the reflective insulating layer to expose the transparent electrode layer; forming a p-electrode to cover the reflective insulating layer; bonding a support substrate onto the p-electrode with a bonding metal; and removing the growth substrate. The p-electrode is electrically connected to the exposed transparent electrode layer. The reflective insulating layer may be a DBR.

An exemplary embodiment of the present invention discloses an LED comprising: a support substrate; a semiconductor stack positioned on the support substrate, the semiconductor stack including a p-type compound semiconductor layer, an active layer, and an n-type compound semiconductor layer; a first electrode positioned between the support substrate and the semiconductor stack in ohmic-contact with the semiconductor stack, the first electrode having a region exposed to the outside of the semiconductor stack; a first bonding pad positioned on the region of the first electrode, exposed to the outside of the semiconductor stack, the first bonding pad being electrically connected to the first electrode; and a second electrode positioned on the semiconductor stack, wherein a plurality of protrusions are formed on an upper surface of the semiconductor stack, and the plurality of protrusions have an etched surface and a deposition is surface of a dielectric material that is formed on the etched surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
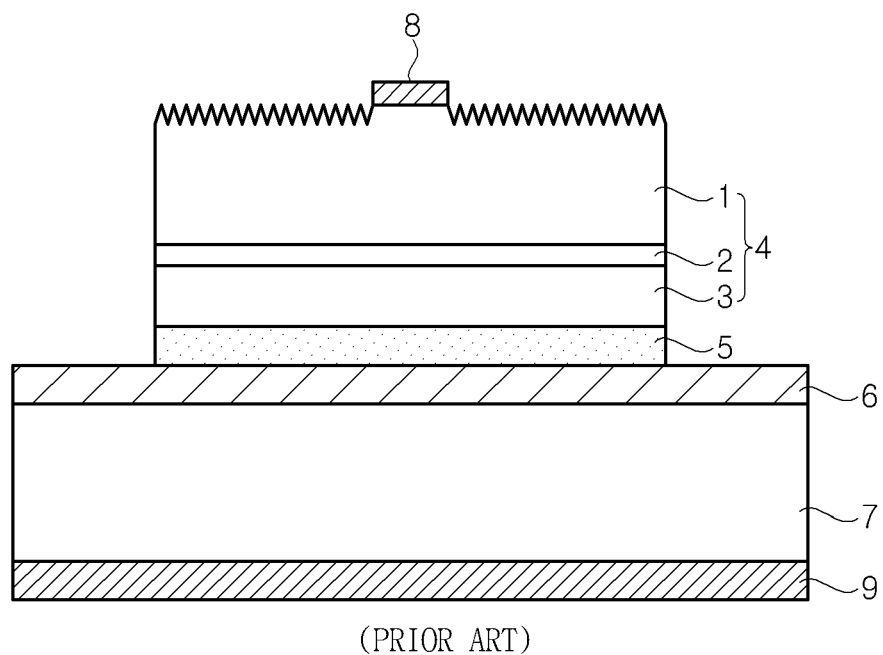
FIG. 1 is a sectional view illustrating a conventional vertical-type light emitting diode (LED).

Hereinafter, exemplary embodiments of the present invention will be described in detail with reference to the accompanying drawings. The following exemplary embodiments are provided only for illustrative purposes, so that those skilled in the art can fully understand the spirit of the present invention. Therefore, the present invention is not limited to the following exemplary embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are is no intervening elements or layers present.

Figure 2:
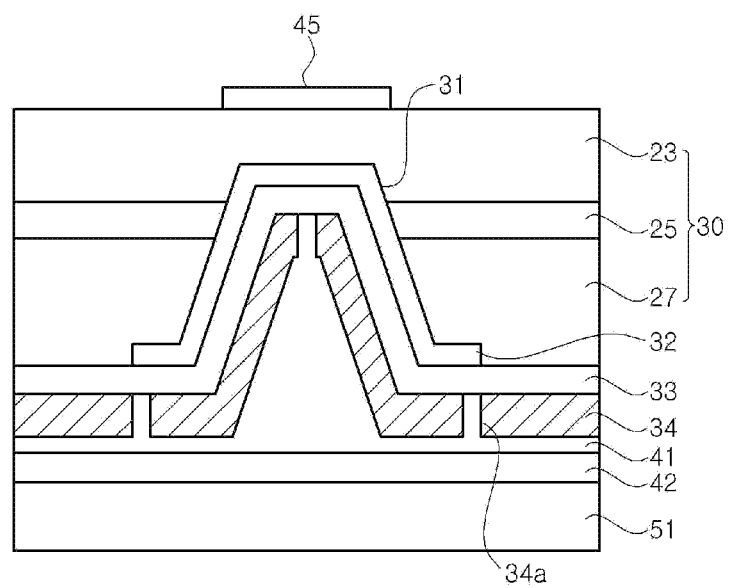
FIG. 2 is a sectional view illustrating a high-efficiency LED, according to an exemplary embodiment of the present invention.
Figure 3:
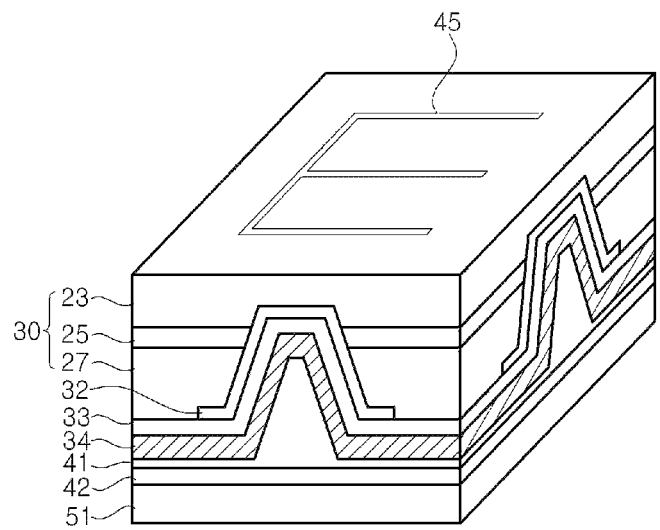
FIG. 3 is a perspective view of the high-efficiency LED of FIG. 2.
Figure 4:
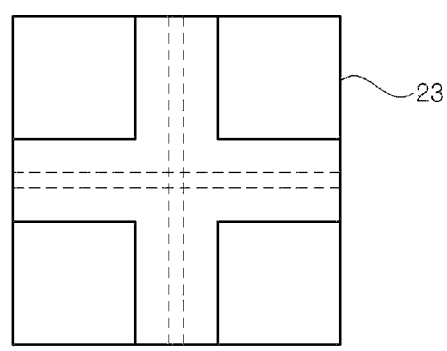
FIG. 4 is a plan view illustrating the high-efficiency LED of FIG. 2.

FIG. 2 is a sectional view illustrating a high-efficiency LED, according to an exemplary embodiment of the present invention, and FIGS. 3 and 4 are a perspective view and a plan view illustrating the high-efficiency LED, respectively. Referring to FIGS. 2-4, the LED comprises a support substrate 51, a semiconductor stack 30, an opening 31, an insulating layer 32, a transparent electrode layer 33, a reflective insulating layer 34, a p-electrode 41, a bonding metal 42, and an n-electrode 45.

The support substrate 51 is not used as a growth substrate for growing the semiconductor stack 30. Instead, the support substrate is a secondary substrate that is attached to the previously grown semiconductor stack 30. Although the support substrate 51 may be a sapphire substrate, it is not limited thereto. For example, the support substrate 51 may be any suitable insulating or conductive substrate. For example, the support substrate 51 may be one of a Si, SiC, AlN, Si—Al, and CuW substrate. Particularly, in a case where a sapphire or CuW substrate is used as the growth substrate, the support substrate 51 may have a thermal expansion coefficient that is substantially identical to that of the growth substrate. Hence, it is possible to prevent a wafer from being bent when bonding the support substrate 51 and removing the grown substrate.

The semiconductor stack 30 is positioned on the support substrate 51, and comprises a p-type compound semiconductor layer 27, an active layer 25, and an n-type compound semiconductor layer 23. In the semiconductor stack 30, the p-type compound semiconductor layer 27 is positioned closer to the support substrate 51 than the n-type compound semiconductor layer 23, like a general vertical-type LED. The semiconductor stack 30 may be positioned on a portion of the support substrate 51.

The n-type compound semiconductor layer 23, the active layer 25, and the p-type compound semiconductor layer 27 may be formed of a nitride-based compound semiconductor, e.g., an (Al, Ga, In)N semiconductor. Each of the n-type and p-type compound semiconductor layers 23, 27 may be formed of single or multiple layers. For example, the n-type compound semiconductor layer 23 and/or the p-type compound semiconductor layer 27 may comprise a contact layer and a cladding layer, and may comprise a superlattice layer. In addition, the active layer 25 may have a single or multiple quantum well structure. The n-type compound semiconductor layer 23 has a relatively low resistance and is positioned distal to the support substrate 51, so that an upper surface of the n-type compound semiconductor layer 23 can be easily roughened. The roughened surface enhances the extraction efficiency of light generated by the active layer 25.

The opening 31 passes through the p-type compound semiconductor layer 27 and the active layer 25, to expose a portion of the n-type compound semiconductor layer 23. The opening 31 may divide the p-type compound semiconductor layer 27 and active layer 25 into at least two regions. The opening 31 may be formed as a trench, a groove, or holes, and there may be a plurality of the openings 31. For example, if the opening 31 is formed as a trench, the opening 31 may divide the p-type compound semiconductor layer 27 and active layer 25 into four regions, as shown in FIG. 3. In addition, the opening 31 may be formed as a plurality holes arranged in a matrix. Thus, it will be understood that the present invention is not limited to any specific number or shape of the opening 31.

The insulating layer 32 covers the exposed surface of the n-type compound semiconductor layer 23 and sidewall(s) of the opening 31. For example, the insulating layer 32 may be formed of a silicon nitride or a silicon oxide material. The insulating layer 32 insulates is the transparent electrode layer 33 from the n-type compound semiconductor layer 23, the active layer 25, and the p-type compound semiconductor layer 27.

Inside the semiconductor stack 30, the insulating layer 32 may perform a current blocking operation. That is, the insulating layer 32 distributes the current that flows between the n-type compound semiconductor layer 23 and the p-electrode 41, laterally across the n-type compound semiconductor layer 23, thereby reducing a current concentration phenomenon that results from the current flowing in an excessively vertical direction through the n-type compound semiconductor layer 23.

The transparent electrode layer 33 is formed to cover the insulating layer 32 and the p-type compound semiconductor layer 27. The transparent electrode layer 33 is disposed in ohmic-contact with the p-type compound semiconductor layer 27. The transparent electrode layer 33 may be formed of a transparent metal or metal oxide, such as Ni/Au, ITO, or ZnO. The transparent electrode layer 33 may also be formed of at least one metal selected from silver (Ag), platinum (Pt), palladium (Pd), rhodium (Rh), and nickel (Ni). The transparent electrode layer 33 may have a single- or multi-layered structure. For example, the transparent electrode layer 33 may include a first layer is formed of platinum (Pt) and a second layer formed of silver (Ag) disposed thereon.

The reflective insulating layer 34 is formed to cover the transparent electrode layer 33. The reflective insulating layer 34 has a high reflectivity and reflects light from the active layer 25 away from the support substrate 51. The reflective insulating layer 34 may be formed to have a plurality of openings 34a through which portions of the transparent electrode layer 33 are exposed.

The reflective insulating layer 34 has a higher reflectance than Al or Ag, and may include, for example, at least one element selected from Si, Ti, Ta, Nb, In, and Sn. In addition, the reflective insulating layer 34 may be formed by alternately stacking at least two layers selected from $Si_xO_yN_z$, $Ti_xO_y$, $Ta_xO_y$, and $Nb_xO_y$ layers. In some embodiments, the reflective insulating layer 34 may be a distributed Bragg reflector (DBR). A DBR can maximize the reflectance for light of a specific wavelength, by adjusting the optical thicknesses of high and low refractive index layers alternately stacked therein. Thus, the reflective insulating layer 34 may be a DBR may have a reflectance optimized according to the wavelength of light generated in the active layer 25. In particular, the reflective insulating layer 34 may be configured to have a high reflectance for ultraviolet, visible, or infrared light, for example. Preferably, the reflective insulating layer 34 includes a $Si_xO_yN_z$ outermost insulating layer that is in contact with the transparent electrode layer 33. Since the adhesion between the transparent electrode layer 33 and the $Si_xO_yN_z$ layer is high, it is possible to prevent a peeling phenomenon between the reflective insulating layer 34 and the transparent electrode layer 33.

The reflective insulating layer 34 can reflect the light that advances inside of the semiconductor stack 30. Thus, a light path is shortened within the semiconductor stack 30, thereby reducing light loss. Particularly, in order to enhance light extraction by the reflective insulating layer 34 in the opening 31, the opening 31 may be formed to have a width that narrows as it approaches the n-type compound semiconductor layer 23.

The p-electrode 41 is formed to cover the reflective insulating layer 34. The p-electrode 41 may be formed of a reflective metal, for example. A portion of the p-electrode 41 may be exposed to the outside of the semiconductor stack 30.

The n-electrode 45 is formed on top of the n-type compound semiconductor layer 23. The n-electrode 45 may be in ohmic-contact with the n-type compound semiconductor layer 23.

The bonding metal 42 may be positioned between the support substrate 51 and the p-electrode 41. The bonding metal 42 may be formed of Au—Sn. The support substrate 51 is adhered to the semiconductor stack 30 through eutectic bonding with the bonding metal 42. However, the support substrate 51 and the semiconductor stack 30 may be bonded using any suitable bonding method.

According to this embodiment, the reflectance of the light that is projected towards the support substrate 51 is increased, by employing the reflective insulating layer 34, which has a process-stability and higher reflectance than Al or Ag. Thus, it is possible to provide a high-efficiency LED having a high light extraction efficiency.

Figure 5:
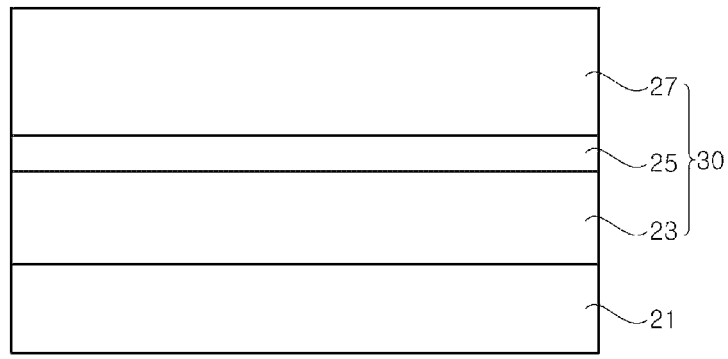
FIGS. 5, 6, 7, 8, 9, 10, 11, 12, and 13 are sectional views illustrating a method of fabricating a high-efficiency LED, according to an exemplary embodiment of the present invention.

Hereinafter, a method for fabricating a high-efficiency LED, according to an exemplary embodiment of the present invention, will be briefly described with reference to FIGS. 5, 6, 7, 8, 9, 10, 11, 12, and 13. Referring to FIG. 5, a semiconductor stack 30, comprising an n-type compound semiconductor layer 23, an active layer 25, and a p-type compound semiconductor layer 27, is grown on a growth substrate 21, such as a sapphire substrate.

Figure 6:
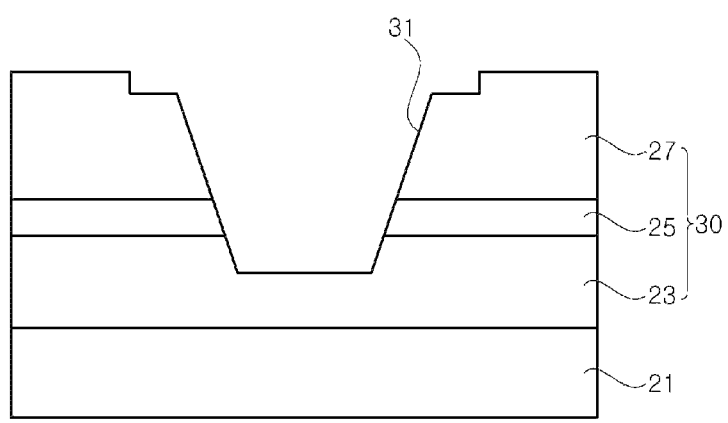

Referring to FIG. 6, an opening 31, through which the n-type compound semiconductor layer 23 is exposed, is formed by etching the p-type compound semiconductor layer 27 and the active layer 25. The opening 31 may comprise a plurality of openings disposed in the shape of a matrix.

Figure 7:
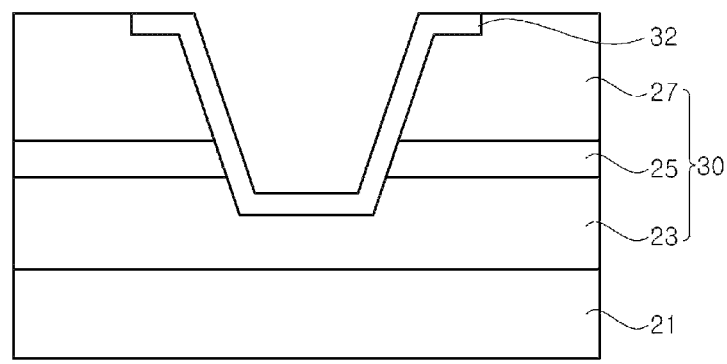

Referring to FIG. 7, an insulating layer 32 is formed to cover the exposed portion of the n-type compound semiconductor layer 23 and the in the opening 31. The insulating layer 32 contacts the sidewalls of the opening 31. The insulating layer 32 also covers the bottom surface of the opening 31, i.e., the exposed portion of the n-type compound semiconductor layer 23.

Figure 8:
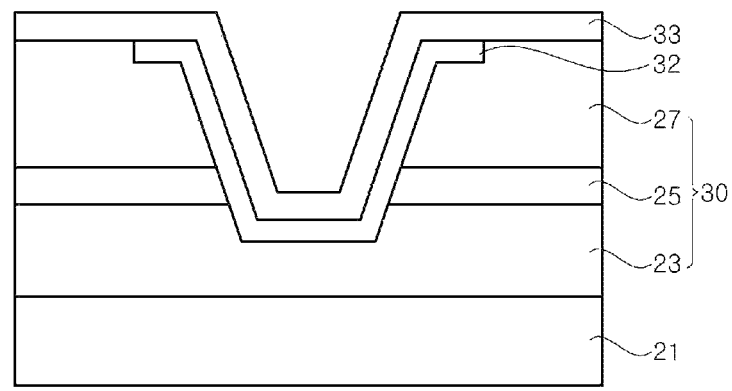
Figure 9:
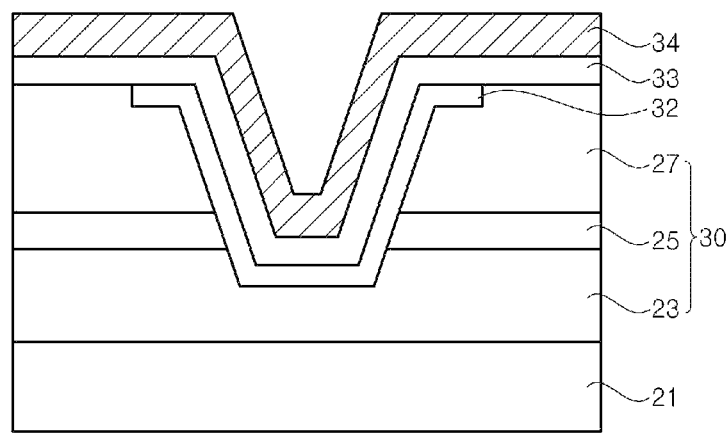

Referring to FIG. 8, a transparent electrode layer 33 is formed to cover the insulating layer 32 and the p-type compound semiconductor layer 27. Referring to FIG. 9, a reflective insulating layer 34 is formed to cover the transparent electrode layer 33. The reflective insulating layer 34 may have a higher reflectance than Al or Ag. For example, the reflective insulating layer 34 may include at least one element selected from Si, Ti, Ta, Nb, In, and Sn. The reflective insulating layer 34 may be formed by alternately stacking at least two layers selected from $Si_xO_yN_z$, $Ti_xO_y$, $Ta_xO_y$, and $Nb_xO_y$ layers. In some embodiments, the reflective insulating layer may be a DBR.

Figure 10:
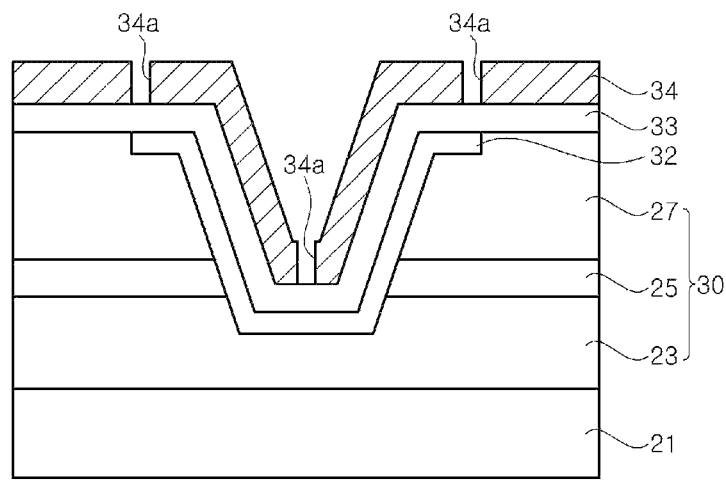

Referring to FIG. 10, the reflective insulating layer 34 is partially removed, so that a portion of the transparent electrode layer 33 is exposed. That is, a plurality of openings 34a, through which the transparent electrode layer 33 is exposed, are formed in the reflective insulating layer 34. The openings 34a may be formed along the top of the insulating layer 32. Furthermore, the openings 34a may be formed through the transparent electrode layer 33.

Figure 11:
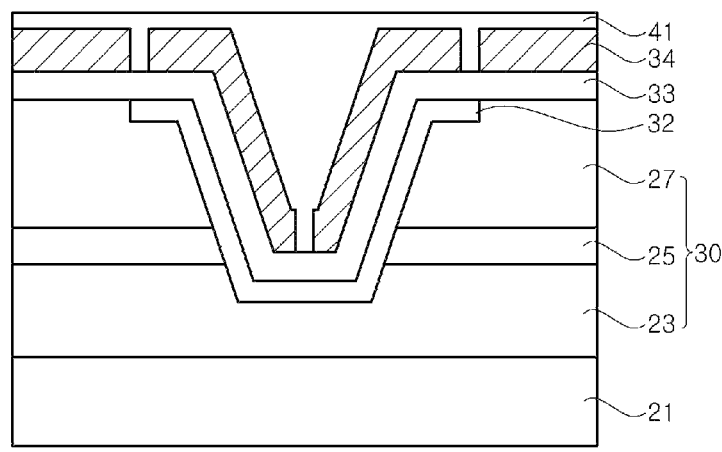

Referring to FIG. 11, a p-electrode 41 is formed to cover the reflective insulating layer 34. The p-electrode 41 may extend into the openings 34a, so as to contact the transparent electrode layer 33. Accordingly, the p-electrode 41 can be electrically connected to the transparent electrode layer 33.

Figure 12:
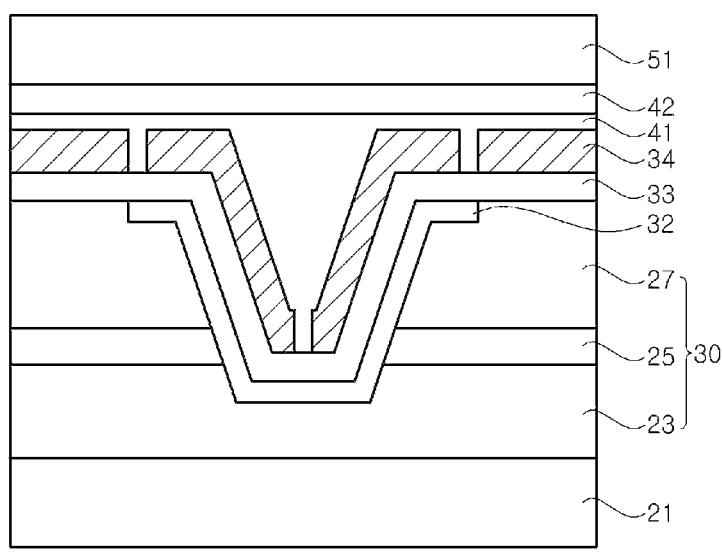

Referring to FIG. 12, a bonding metal layer is formed on the p-electrode 41, and a bonding metal layer is also formed on a support substrate 51. Then, these metal layers are bonded to each other to form a bonding metal 42 that attaches the support substrate 51 to the compound semiconductor stack 30.

Figure 13:
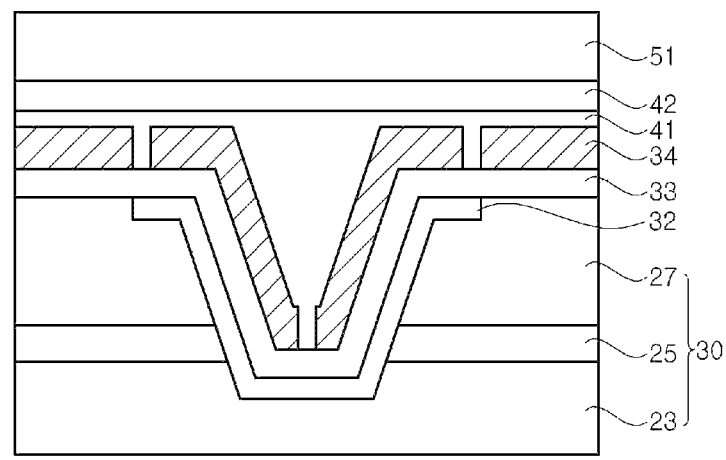

Referring to FIG. 13, the growth substrate 21 is removed using a laser lift-off is technique or the like, and the upper surface of the n-type compound semiconductor 23 is exposed. Herein, an upper surface of an element refers to a surface that faces away from the support substrate 51. Thereafter, an n-electrode 45 is formed on the upper surface of the n-type compound semiconductor layer 23, and the entire structure is divided into individual LED chips, thereby completing the LED shown in FIG. 2.

Figure 14:
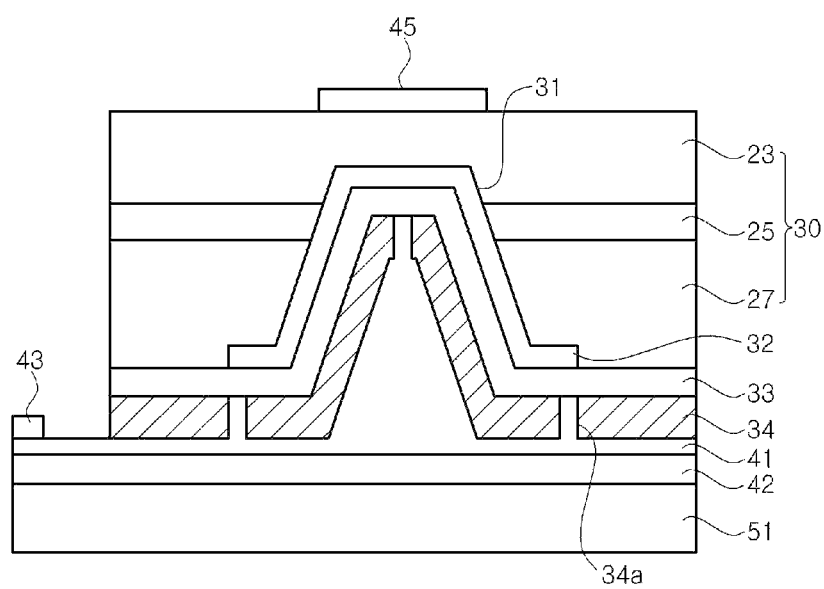
FIG. 14 is a sectional view illustrating a high-efficiency LED, according to an exemplary embodiment of the present invention, in which a p-electrode pad is formed outside of a semiconductor stacked structure.

FIG. 14 is a sectional view illustrating a high-efficiency LED, according to an exemplary embodiment of the present invention. Referring to FIG. 14, the structure of the LED is similar to that of the LED shown in FIG. 2, but the support substrate 51, the bonding metal 42, and the p-electrode 41 extend past the semiconductor stack 30. Accordingly, a portion of the p-electrode 41 is exposed outside of the semiconductor stack 30. A p-electrode pad 43 is formed on the exposed portion of the p-electrode 41.

Figure 15:
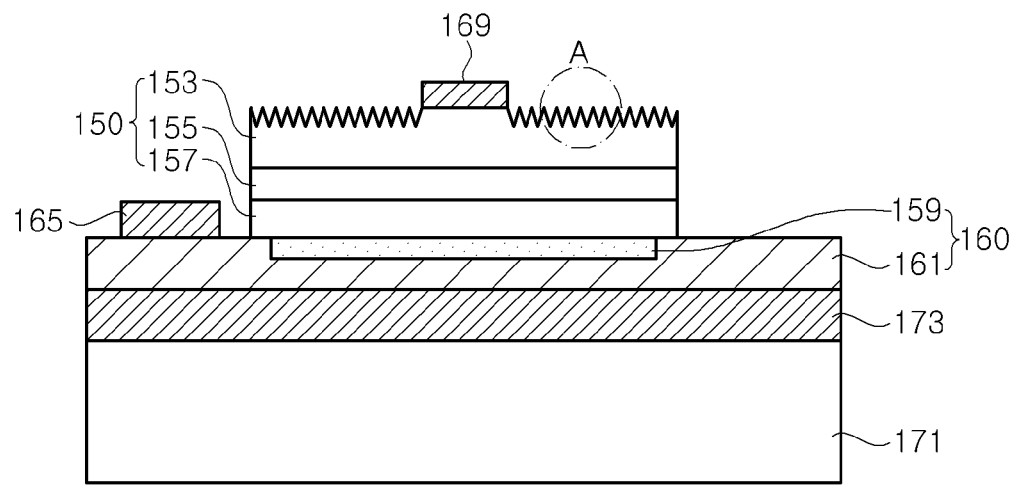
FIG. 15 is a sectional view illustrating an LED, according to another exemplary is embodiment of the present invention.
Figure 16:
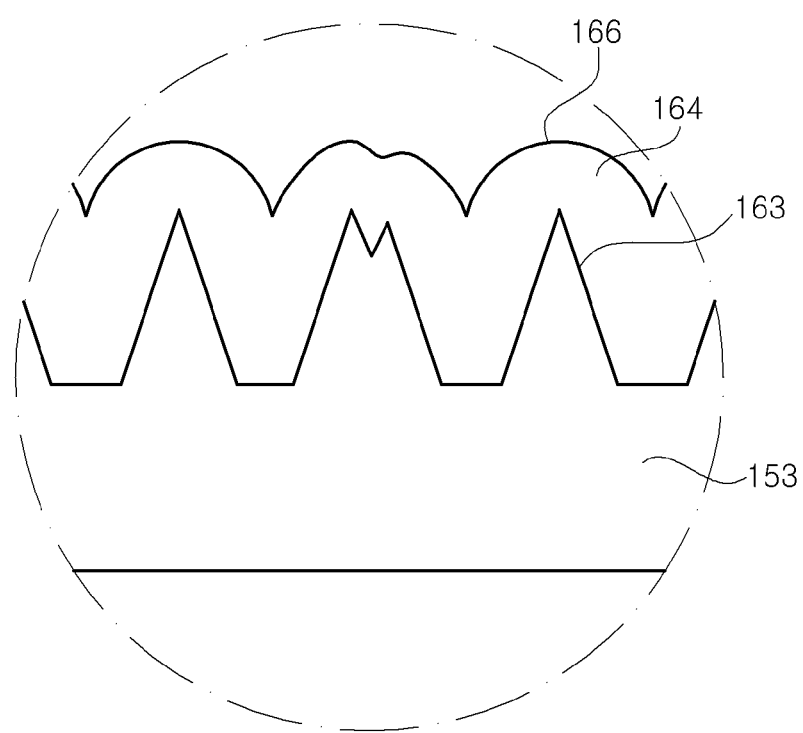
FIG. 16 is an enlarged view showing a partial surface of the LED of FIG. 15.

FIG. 15 is a sectional view illustrating an LED, according to another embodiment of the present invention, and FIG. 16 is an enlarged view showing a surface portion A of the LED of FIG. 15. Referring to FIGS. 15 and 16, the LED comprises a support substrate 171, a bonding metal 173, a semiconductor stack 150, a p-electrode 160, an n-electrode 169, and a p-bonding pad 165.

The support substrate 171 is similar to the support substrate 51. The semiconductor stack 150 is positioned on the support substrate 51, and comprises a p-type compound semiconductor layer 157, an active layer 155, and an n-type compound semiconductor layer 153. The p-type compound semiconductor layer 157 is positioned closer to the support substrate 171 than the n-type compound semiconductor layer 153. The semiconductor stack 150 is positioned on a portion of the support substrate 171. That is, the support substrate 171 has a larger surface area than the semiconductor stack 150, and edges of the support substrate 171 is surround the semiconductor stack 150.

The n-type compound semiconductor layer 153, the active layer 155, and the p-type compound semiconductor layer 157 may be formed of a nitride-based compound semiconductor, e.g., an (Al, Ga, In)N semiconductor. Each of the n-type and p-type compound semiconductor layers 153 and 157 may have a single or multi-layered structure. For example, the n-type compound semiconductor layer 153 and/or the p-type compound semiconductor layer 157 may comprise a contact layer and a cladding layer, and may comprise a superlattice layer. In addition, the active layer 155 may have a single or multiple quantum well structure. The n-type compound semiconductor layer 153 has a relatively low resistance and is positioned distal to the support substrate 171, so that the upper surface of the n-type compound semiconductor layer 153 can be easily roughened. The roughened surface enhances the extraction efficiency of light generated in the active layer 155.

The n-type compound semiconductor layer 153 has a roughened upper surface that is coated with a dielectric material 164. Specifically, as shown in FIG. 16, protrusions 163 are formed by etching the upper surface of the n-type compound semiconductor layer 153. The dielectric material 164 is deposited on the n-type compound semiconductor layer 153, so as to cover the protrusions 163.

The p-electrode 160 is positioned between the p-type compound semiconductor layer 157 and the support substrate 171, and is in ohmic-contact with the p-type compound semiconductor layer 157. The p-electrode 160 comprises a reflection layer 159, and a protection layer 161. The reflection layer 159 may be embedded in the protection layer 161 and disposed between the semiconductor stack 150 and the support substrate 171. For example, the reflection layer 159 may be formed of a reflective metal such as Ag, and the protection layer 161 may be is formed of a metal such as Ni. The protection layer 161 may cover the entire upper surface of the support substrate 171. Thus, the protection layer 161 is exposed outside of the semiconductor stack 150.

A p-type bonding pad 165 may be positioned on the exposed portion of the protection layer 161. The p-type bonding pad 165 is electrically connected to the p-type compound semiconductor layer 157 through the protection layer 161 and the reflection layer 159.

The bonding metal 173 is positioned between the support substrate 171 and the p-electrode 160, to join the semiconductor stack 150 and the support substrate 171. For example, the bonding metal 173 may be formed of Au—Sn through eutectic bonding.

The p-type electrode 160 is flip-bonded to the support substrate 171 through the bonding metal 173. The upper surface of the n-type compound semiconductor layer 153 is exposed through the removal of the growth substrate. Meanwhile, the n-electrode 169 is positioned on the semiconductor stack 150 and is electrically connected to the upper surface of the n-type compound semiconductor layer 153. The upper surface of the n-type compound semiconductor layer 153 is roughened using a dry or photo electro chemical (PEC) etching technique, thereby enhancing light extraction efficiency. The roughened surface may be formed using a PEC etching technique. That is, the roughened surface may be formed by or PEC etching the upper surface of the n-type compound semiconductor layer 153, thereby enhancing light extraction efficiency.

The PEC etching may be performed in an aqueous solution, while irradiating the LED with ultraviolet light having an energy level greater than the energy bandgap of GaN. For example, the PEC etching may be performed using a KOH solution as an electrolyte and a Xe lamp as a light source. An etchant for etching an intermediate, such as $Ga_2O_3$, and an oxidizer is may be included in the KOH solution. Meanwhile, a Hg lamp may be used as the light source. Accordingly, the upper surface of the n-type compound semiconductor layer 153 is etched. The etching of the n-type compound semiconductor layer 153 is related to a crystalline direction of a semiconductor layer. That is, the PEC etching forms protrusions 163 on the upper surface of the semiconductor layer 153. The protrusions 163 are formed by differences in crystal grain patterns at the upper surface of the semiconductor layer 153.

In a case where the PEC etching is performed on a crystalline compound semiconductor layer, the progression rate of the PEC etching may be changed, depending on the orientation of the crystal grain patterns at the upper surface of the compound semiconductor layer. Accordingly, the PEC etching progresses along the crystal faces at the surface of the compound semiconductor layer 153. As a result, the PEC etching is performed so that the crystal faces of the grain patterns are exposed.

In this procedure, the protrusions 163 may be pyramidal in shape. Since a 10-1-1 plane of GaN is stable, the protrusions 163 have generally hexagonal bases, i.e., the protrusions are generally in the form of hexagonal pyramids. The protrusions 163 are related to crystalline defects (grain boundaries) that exist in GaN. Hence, the protrusions 163 may have various shapes and may be separated from one another by flat portions of the upper surface of the n-type compound semiconductor layer 153. The dielectric material 164 is deposited on the upper surface, so as to cover the protrusions 163. A material such as $SiO_2$, $TiO_2$ or $Si_2N_2$ may be used as the dielectric material 164.

The upper surface of the dielectric material 164 has a lower surface roughness than the upper surface of the n-type compound semiconductor layer 153 163. Protrusions 166 may be formed in the upper surface of the dielectric material 164. Some of the protrusions 166 is may cover least two of the protrusions 163. That is, the protrusions 163 may be split or irregularly formed/combined during the PEC etching process. In this case, the irregularly formed protrusions 164 can be covered to form more uniform protrusions 166 in the surface of the dielectric material 164. In addition, although not shown, the dielectric material 164 may comprise additional protrusions that are formed between the protrusions 163.

The protrusions 164 may have lower slopes than the protrusions 163. In other words, the upper surface of the n-type compound dielectric layer 164 has a lower surface roughness than the upper surface of the dielectric material 164. Accordingly, the total reflection of light inside of the active layer 155 is reduced and more light can be extracted.

Figure 17:
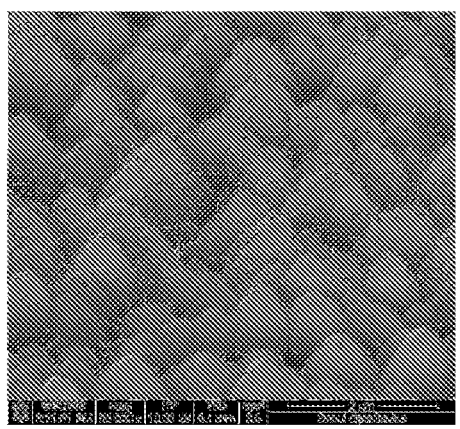
FIGS. 17 and 18 are scanning electron microscope (SEM) photographs showing a gently sloped deposition surface of a dielectric material.
Figure 18:
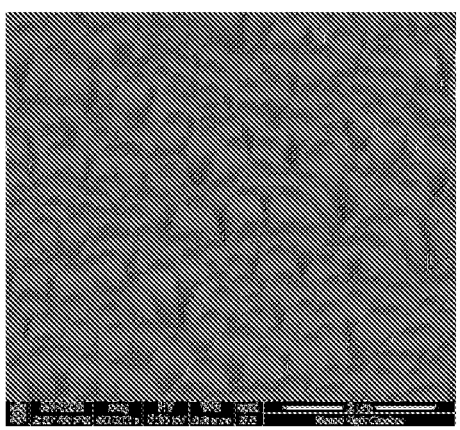

FIGS. 17 and 18 are scanning electron microscope (SEM) micrographs showing the surface of an n-type compound semiconductor layer that is coated with a dielectric material, according to an exemplary embodiment of the present invention. Referring to FIGS. 17 and 18, protrusions are formed in the surface of the dielectric material. Here, it can be seen that each of the protrusions is generally conical (dome-shaped).

Figure 19:
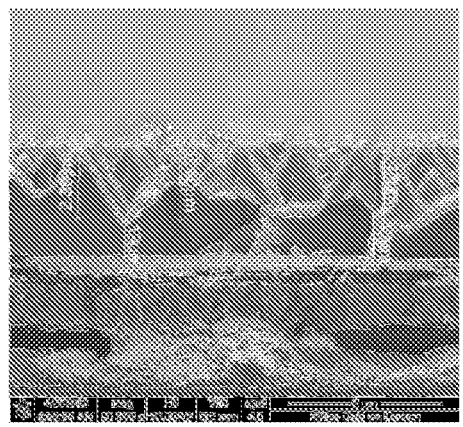
FIGS. 19 and 20 are SEM photographs showing an etched surface having a steep slope in a state where the dielectric material is removed.
Figure 20:
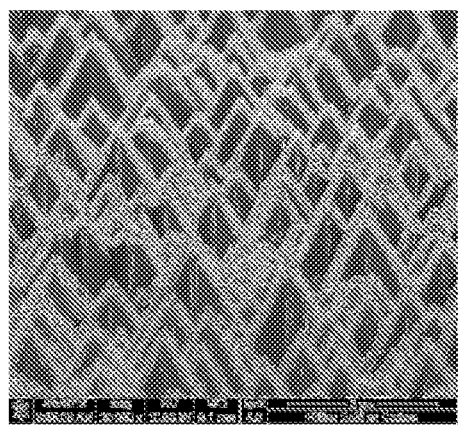

FIGS. 19 and 20 are SEM micrographs showing uncoated surfaces of an n-type compound semiconductor layer having a steeply sloped protrusions formed thereon. Referring to FIGS. 19 and 20, it can be seen that the protrusions formed through PEC etching have pyramidal or prismatic shapes, due to the crystal grains of the n-type compound semiconductor layer. In other words, the protrusions have surfaces that are sharply angled.

As described above, if the surface of the n-type compound semiconductor layer is covered by the dielectric material, which has a relatively lower upper surface roughness as compared to the upper surface of the n-type compound semiconductor layer. As a result, light extraction efficiency is enhanced. Accordingly, the total reflection of light inside of the is associated active layer is reduced, thereby increasing light extraction efficiency.

Figure 21:
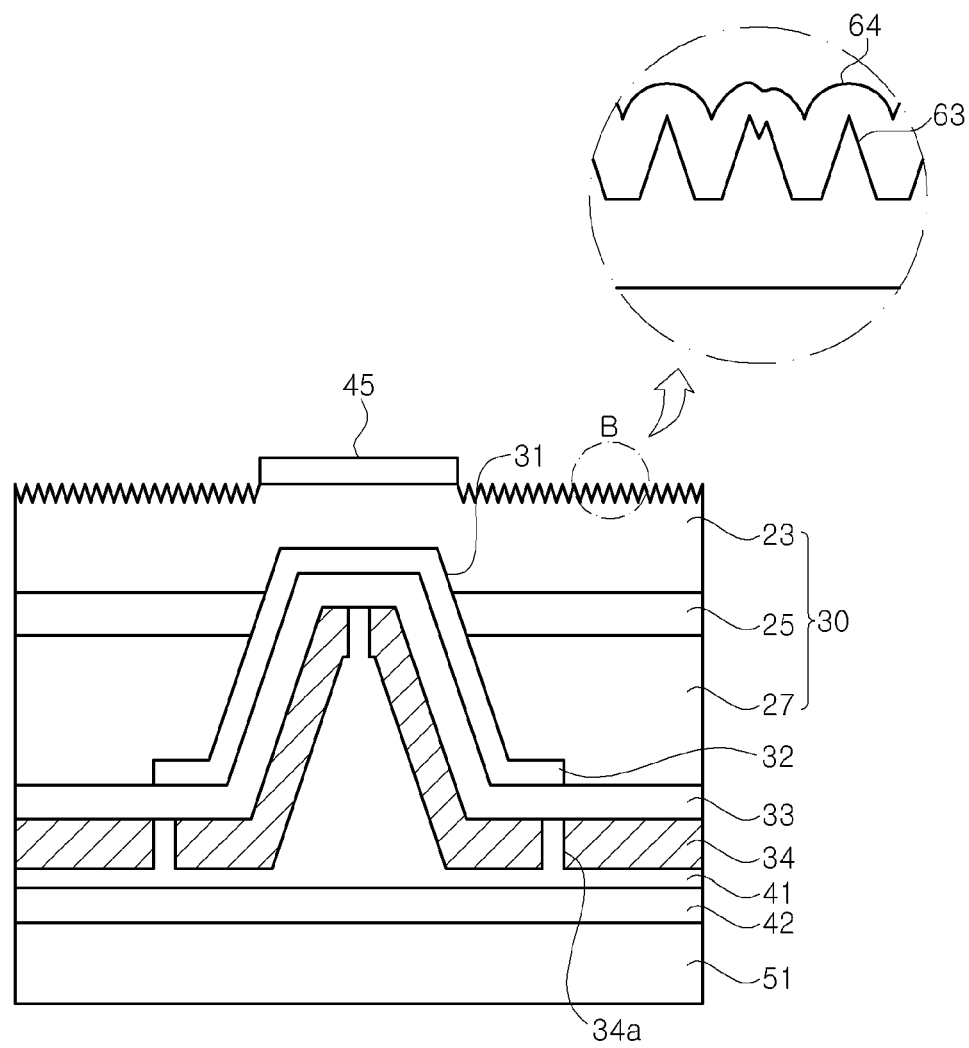
FIG. 21 is a sectional view illustrating an LED, according to an exemplary embodiment of the present invention.

FIG. 21 is a sectional view illustrating an LED, according to an exemplary embodiment of the present invention. Referring to FIG. 21, the structure of the LED is similar to that of the LED shown in FIG. 2, except that a plurality of protrusions 63 are formed on the upper surface of the n-type compound semiconductor layer 23. The protrusions 63 are formed by etching the upper surface of the n-type compound semiconductor layer 23. A dielectric material 64 is deposited on the upper surface of n-type compound semiconductor layer 23. The shapes and properties of the protrusions 63 and the dielectric material 64 are similar to those described with reference to FIGS. 15 and 16.

Figure 22:
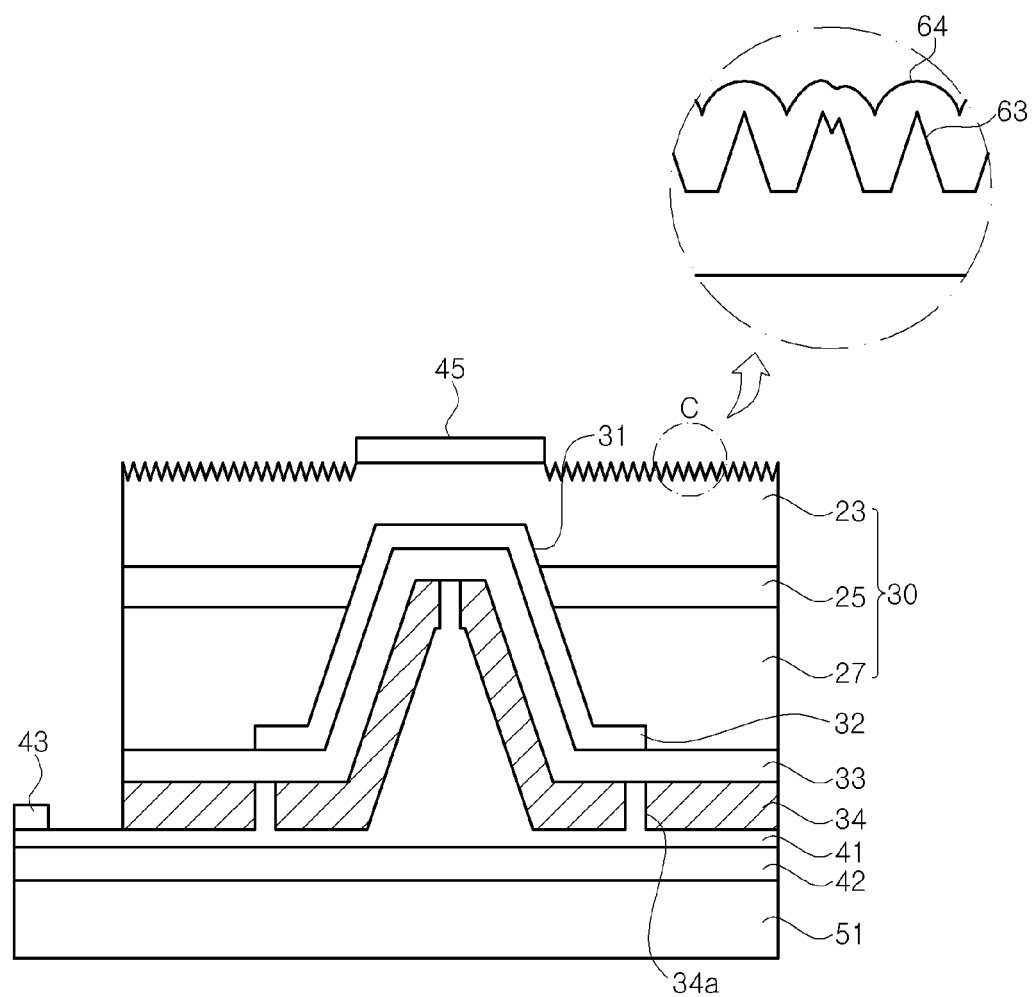
FIG. 22 is a sectional view illustrating an LED, according to a still further exemplary embodiment of the present invention.

FIG. 22 is a sectional view illustrating an LED, according to a still further embodiment of the present invention. Referring to FIG. 22, the structure of the LED is similar to that of the LED shown in FIG. 14, except that a plurality of protrusions 63 are formed on the upper surface of the n-type compound semiconductor layer 23. As can be seen in the enlarged surface portion C of the LED, the protrusions 63 are covered with a dielectric material 63. The shapes and properties of the protrusions 63 and the dielectric material 64 are similar to those described with reference to FIGS. 15 and 16.

According to aspects of the present invention, it is possible to provide a high-efficiency LED, wherein the light generated in an active layer is reflected by a reflective insulating layer. Thus, a light radiation path can be shortened, thereby enhancing the light extraction efficiency. Further, it is possible to provide a high-efficiency LED capable of enhancing the reflection of the light that advances toward a support substrate, by employing the reflective insulating layer. Furthermore, the reflective insulating layer can be in the form of a DBR, so that the reflectance can be optimized for the wavelength of the light generated from the is active layer.

In addition, according to aspects of the present invention, a current blocking region is formed, so that current between n-type and p-type electrodes can be spread laterally, by reducing the concentration of current flowing vertically toward the n-type electrode. Accordingly, the light emitting efficiency and static electricity resistance of an LED can be enhanced.

Moreover, according to aspects of the present invention, if a deposition surface of a dielectric material is formed by PEC etching an upper surface of an n-type compound semiconductor layer and depositing the dielectric material on the etched surface, the upper surface of the dielectric material can have a lower surface roughness than the upper surface of the n-type compound semiconductor layer. As such, a light extraction efficiency can be enhanced. Accordingly, the total reflectance of the light rays inside of the active layer is reduced, and more light rays can be emitted to the outside of the active layer.

Although the present invention has been described in connection with the exemplary embodiments, it will be understood by those skilled in the art that various modifications and changes can be made thereto, without departing from the spirit and scope of the present invention. Thus, it should be understood that the aforementioned exemplary embodiments are described not to limit, but to better understand the technical spirit of the present invention. The scope of the present invention is not limited to the aforementioned exemplary embodiments but should be interpreted by the appended claims. The technical spirit within the scope substantially identical with the scope of the present invention should be interpreted to fall in the scope of the present invention.

For example, it has been described in the aforementioned embodiments that the p-type compound semiconductor layer 157 is positioned closer to the support substrate 171 than the n-type compound semiconductor layer 153. However, the present invention is not limited thereto. For example, the n-type compound semiconductor layer 153 may be positioned closer to the support substrate 171 than the p-type compound semiconductor layer 157. In this case, the polarities of the n-electrode 169, the p-electrode 159 and 161 and the p-type bonding pad 165 are reversed.

What is claimed is:

1. A light emitting diode (LED) comprising:
    a support substrate;
    a semiconductor stack disposed on the support substrate, the semiconductor stack comprising a p-type compound semiconductor layer, an n-type compound semiconductor layer, and an active layer disposed between the p-type compound semiconductor layer and the n-type compound semiconductor layer, the p-type compound semiconductor layer being disposed closer to the support substrate than the n-type compound semiconductor layer, the semiconductor stack having a first opening that divides the p-type compound semiconductor layer and the active layer, and exposes a portion of the n-type compound semiconductor layer, the portion facing the support substrate;
    an insulating layer disposed on the exposed portion of the n-type compound semiconductor layer and a sidewall of the opening;
    a transparent electrode layer disposed in ohmic-contact with the p-type compound semiconductor layer and covering the insulating layer and the p-type compound semiconductor layer;
    a reflective layer covering the transparent electrode layer, to reflect light emitted from the active layer away from the support substrate;
    a p-electrode covering the reflective layer; and
    an n-electrode disposed on an upper surface of the n-type compound semiconductor layer,
    wherein the p-electrode is electrically connected to the transparent electrode layer through at least one second opening formed in the reflective insulating layer,
    wherein a width of the first opening decreases as it approaches the n-type compound semiconductor layer.

2. The LED as claimed in claim 1, further comprising a p-electrode pad disposed on a portion of the p-electrode that extends outside of the semiconductor stack.

3. The LED as claimed in claim 1, wherein the reflective insulating layer is a distributed Bragg reflector (DBR).

4. The LED as claimed in claim 1, wherein the reflective layer is formed by alternately stacking at least two layers selected from the group consisting of SixOyNz, TixOy, TaxOy, and NbxOy.

5. The LED as claimed in claim 1, wherein the reflective layer comprises at least one element selected from the group consisting of Si, Ti, Ta, Nb, In, and Sn.

6. The LED as claimed in claim 1, further comprising a bonding metal disposed between the p-electrode and the support substrate.

7. The LED as claimed in claim 1, wherein the transparent electrode layer comprises a metal or a conductive metal oxide.

8. The LED as claimed in claim 1, wherein the reflective layer has a plurality of the second openings that are filled with portions of the p-electrode.

9. The LED as claimed in claim 1, wherein:
    first protrusions are formed on the upper surface of the n-type compound semiconductor layer; and
    a dielectric material is disposed on the upper surface, so as to cover the first protrusions.

10. The LED as claimed in claim 9, wherein an upper surface of the dielectric material has second protrusions.

11. The LED as claimed in claim 10, wherein: the first protrusions are generally pyramidal, and the second protrusions are generally conical.

12. The LED as claimed in claim 10, wherein at least one of the second protrusions covers at least two of the first protrusions.

13. The LED as claimed in claim 9, wherein the upper surface of the n-type compound semiconductor layer has a higher surface roughness than the upper surface of the dielectric material.

14. The LED as claimed in claim 9, wherein the first protrusions are formed by photo electro chemical etching.

15. A light emitting diode (LED) comprising:
    a support substrate;
    a semiconductor stack disposed on the support substrate and having an upper surface that faces away from the substrate, the semiconductor stack comprising a p-type compound semiconductor layer, an n-type compound semiconductor layer, and an active layer disposed between the p-type compound semiconductor layer and the n-type compound semiconductor layer;
    a first electrode disposed between the support substrate and the semiconductor stack, in ohmic-contact with the semiconductor stack, the first electrode having a first portion that extends into the semiconductor stack to be disposed in the active layer, and a second portion that extends outside of the semiconductor stack;
    a first bonding pad disposed on the second portion of the first electrode outside of the semiconductor stack, the first bonding pad being electrically connected to the first electrode; and
    a second electrode positioned on the upper surface of the semiconductor stack,
    wherein first protrusions are formed on the upper surface of the semiconductor stack, and a dielectric material is disposed on the upper surface, covering the first protrusions, the dielectric material comprising second protrusions disposed on the first protrusions.

16. The LED as claimed in claim 15, wherein the upper surface of the semiconductor stack has a higher surface roughness than an upper surface of the dielectric material.

17. The LED as claimed in claim 15, wherein some of the second protrusions cover more than one of the first protrusions.

18. The LED as claimed in claim 15, wherein the first protrusions are generally pyramidal and the second protrusions are generally conical.

19. The LED as claimed in claim 15, wherein the first protrusions are formed by photo-electro chemical etching.

20. The LED as claimed in claim 15, wherein the support substrate is a sapphire substrate.

21. The LED as claimed in claim 15, wherein the first electrode further comprises a reflection layer.

22. The LED as claimed in claim 21, wherein the reflection layer is between the support substrate and the semiconductor stack.

23. The LED as claimed in claim 15, wherein the first electrode is in ohmic-contact with the p-type compound semiconductor layer.

* * * * *